(12) United States Patent
Parssinen et al.

(10) Patent No.: US 7,522,885 B2
(45) Date of Patent: *Apr. 21, 2009

(54) METHOD AND APPARATUS FOR CONTINUOUSLY CONTROLLING THE DYNAMIC RANGE FROM AN ANALOG-TO-DIGITAL CONVERTER

(75) Inventors: Aarno Parssinen, Espoo (FI); Jussi Vepsalainen, Helsini (FI); Pauli Seppinen, Espoo (FI)

(73) Assignee: Nokia Corporation, Espoo (FI)

( * ) Notice: Subject to any disclaimer, the term of this patent is extended or adjusted under 35 U.S.C. 154(b) by 492 days.

This patent is subject to a terminal disclaimer.

(21) Appl. No.: 11/285,541

(22) Filed: Nov. 21, 2005

(65) Prior Publication Data

US 2006/0079191 A1   Apr. 13, 2006

Related U.S. Application Data

(63) Continuation of application No. 09/977,271, filed on Oct. 11, 2001, now Pat. No. 6,993,291.

(51) Int. Cl.
*H04B 17/00* (2006.01)
(52) U.S. Cl. .............. 455/67.11; 455/226.2; 455/232.1; 341/139
(58) Field of Classification Search ... 455/67.11–67.14, 455/226.1–226.4, 232.1, 138, 139, 239.1; 375/245, 350; 341/155, 164
See application file for complete search history.

(56) References Cited

U.S. PATENT DOCUMENTS 4,910,752 A   3/1990   Yester, Jr. et al.

| | | | |
|---|---|---|---|
| 6,504,863 B1 * | 1/2003 | Hellmark | 455/226.1 |
| 6,843,597 B1 * | 1/2005 | Li et al. | 455/313 |
| 6,993,291 B2 * | 1/2006 | Parssinen et al. | 455/67.11 |

FOREIGN PATENT DOCUMENTS

WO    WO 0055977    9/2000
WO    WO 01/18970   3/2001

OTHER PUBLICATIONS

"Industrial Control: A Tutorial;" F.J. Przybylski; Scientific Honeyweller, Honeywell's Corporate; Minneapolis, US; vol. 10, No. 1, 1989; pp. 6-18.

* cited by examiner

*Primary Examiner*—Edward Urban
*Assistant Examiner*—Adeel Haroon
(74) *Attorney, Agent, or Firm*—Alfred Fressola; Ware, Fressola, Van Der Sluys & Adolphson LLC

(57) ABSTRACT

A method for continuously determining the required dynamic range for an analog-to-digital converter by determining the received signal strength and using this received signal strength value in combination with the overall dynamic range for the ADC and the target resolution of the ADC to decode a radio channel in the absence of interference, wherein the target resolution is also related to the type of decoding to be performed subsequent to analog-to-digital conversion. The method allows for a reduction in power consumption associated with the ADC, especially when the incoming signal is received with few interfering radio channels and with a relatively high signal strength. The present method can be combined with gain control and analog alert detection.

88 Claims, 14 Drawing Sheets

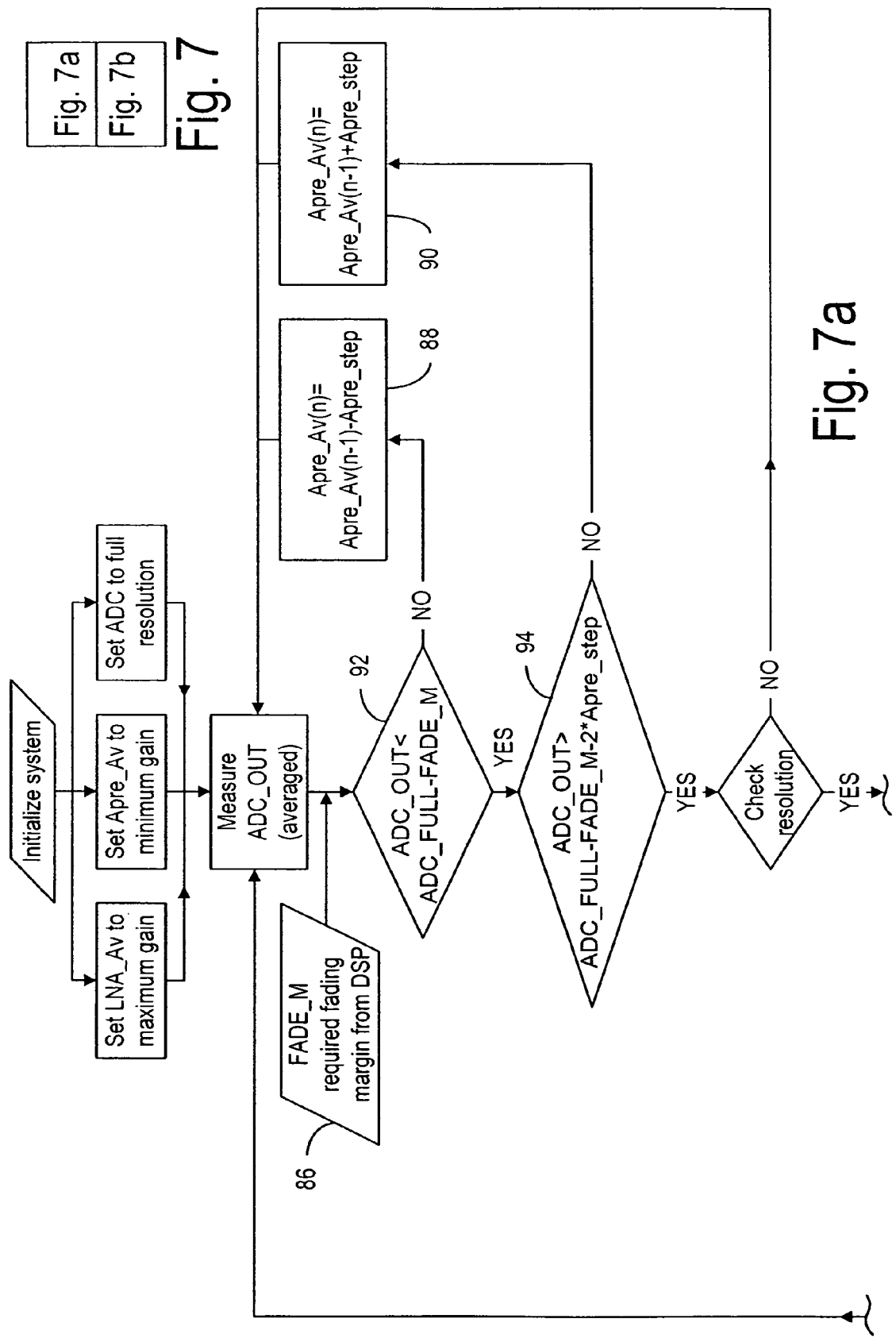

METHOD AND APPARATUS FOR CONTINUOUSLY CONTROLLING THE DYNAMIC RANGE FROM AN ANALOG-TO-DIGITAL CONVERTER

CROSS-REFERENCE TO RELATED APPLICATIONS

This application is a continuation of U.S. patent application Ser. No. 09/977,271 filed on Oct. 11, 2001, now U.S. Pat. No. 6,993,291 and claims domestic priority to said application under 35 USC §120.

TECHNICAL FIELD

The present invention relates to dynamic adjustment of an analog-to-digital converter (ADC) typically for use in a radio receiver. It is particularly adapted to such dynamic adjustment where the ADC operates under fluctuating signal conditions.

BACKGROUND OF THE INVENTION

Analog-to-digital converters (ADCs) are well-known in the electronic art for converting an analog input signal to a digital output signal. As such, they are used in many applications including radio receivers and in particular, mobile radio receivers. Such receivers, and especially mobile receivers, typically operate where the incoming radio frequency (RF) signal fluctuates in signal strength and overall quality due to interference with adjacent radio frequency signals. Such signals, which commonly are radio frequency channels, contain desired information which is to be ultimately decoded by the radio receiver. Both the received radio frequency channel and other radio frequency transmissions at the same or other carrier frequencies close to that of the desired radio frequency channel can change continuously during reception due to the non-constant propagation of radio frequency signals in the radio path from the transmitter to the receiver. Such non-constant propagation can be due to atmospheric conditions, moving objects within the atmosphere such as airplanes, as well as due to the movement of the mobile receiver or transmitter or sources of undesired interferers. As a result, signal levels at the antenna of a radio receiver can vary during the reception of the desired radio frequency channel.

Analog-to-digital converters convert the signal of the desired radio frequency channel and possibly other radio frequency channels that are close in carrier frequency to the desired radio frequency channel into the digital domain and as such, are used in all digitally modulated radio communication systems. Such converters can be found at any of various stages within the radio frequency receiver such as at the baseband, intermediate frequency or radio frequency locations.

As is known in the art, the speed and dynamic range requirements of an ADC depend strongly on the partitioning of the various signal processing blocks between the analog and the digital circuitry. Often, digital signal processing is preferred if the performance of the ADC is sufficient and the power consumption of the ADC is reasonable for a specific application. However, power consumption tends to increase rapidly as the speed and resolution requirements of an ADC increases. This power consumption increase is generally valid for all existing ADC topologies and therefore it is important in applications where power consumption is to be minimized (such as mobile radio frequency receivers) to optimize the dynamic range of the ADC to the anticipated reception conditions for that receiver so as to allow fast settling of the dynamic range during fluctuating radio frequency receiving conditions. This result in turn can be achieved by using controllable analog gain prior to presentation of the analog signal to be converted by the ADC, provided that sufficient analog filtering is present, especially when using the ADC and power limited receiving applications. In applications which are less demanding with respect to power consumption, a maximum dynamic range can be used all the time during reception, even when the larger dynamic range would not otherwise be necessary due to better than anticipated radio receiving conditions.

As seen in FIG. 1, a conventional direct conversion radio frequency receiver which uses analog-to-digital conversion typically operates so that the ADC uses a fixed number of bits at all times. As a result, the current consumed by the ADC is essentially constant. A typical receiver includes automatic gain control and filtering, both in the analog domain, to handle the incoming radio frequency signals so that the level presented to the ADC is approximately constant and hence, the number of bits used by the ADC can be limited to the minimum number required for further digital signal processing. In such prior art receivers, the analog signal processing requires a large maximum gain and a large gain control range in order to be able to receive incoming radio frequency signals having a large range of power levels at different conditions. Such analog gain control circuitry typically has unwanted characteristics including large direct current transients due to mismatches and other non-ideal aspects of such gain control circuitry. These unwanted phenomenon can be avoided and to a great extent, more easily removed with digital signal processing. Due to the development of integrated circuit technology, such digital signal processing can also be achieved with a reasonable amount of power consumption. However in that case, the ADC with a larger dynamic range and a higher sampling rate than in conventional direct conversion receivers with gain control is required. Such an ADC unfortunately consumes a substantial amount of power if used with maximum dynamic range at all times.

SUMMARY OF THE INVENTION

The present invention is directed to continuously controlling the dynamic range of an analog-to-digital converter so as to minimize the power consumption of the associated radio receiver by optimizing the dynamic range of the ADC to the existing radio frequency reception conditions and to allow fast settling of that dynamic range during fluctuating radio receiving conditions. The present invention achieves this result based on performing measurements of parameters which indicate the existing radio frequency signal conditions. As such, the present invention can be used in all ADC architectures, although the measured parameters and the associated values used in the method may vary depending upon the implementation aspects of different ADC architectures. In addition, the present method is valid for all possible radio architectures and for all digitizing frequencies. As such, the received radio channel can be processed with an ADC at baseband, at an intermediate frequency or even at the incoming radio frequency. The specific targeted application of the method is a direct conversion receiver in which most of the channel selection is performed in the digital domain and analog filtering is primarily used for antialiasing and for slight prefiltering purposes.

The method of the present invention is most suitable for mobile radio receiver terminals used in cellular systems but it can also be used at base stations or in fact, at any possible radio system using ADCs in the receiver. In particular, the method according to the present invention determines the required number of bits for the resolution of the ADC when the ADC is in actual use under dynamic incoming conditions. The required number of bits needed for further digital processing of the signal varies with the receiving conditions of the radio frequency channel.

The required number of bits is another way of saying or indicating the dynamic range of the ADC when used in dynamic receiving conditions. As such, the ADC with such dynamic range capability is able to be used with the minimum number of bits or minimum dynamic range necessary for receiving the radio frequency channel under dynamic radio frequency conditions and therefore optimizes the power consumption associated with the ADC and hence, the radio receiver. By determining the required number of bits of the ADC in use under dynamic conditions, the power consumption can be optimized by scaling the biasing current, reducing the supply voltage, removing the number of stages from the converter and/or any other possible means to reduce overall power consumption.

The method of continuously controlling the dynamic range of an ADC according to the present invention is performed by measuring the received radio frequency channel and other signals which may be present at the antenna so as to determine the existing reception conditions based on the signal level of the desired radio channel and any other interfering signals, including other interfering radio frequency channels. The method used is an algorithm to determine the appropriate number of bits (dynamic range) required in the ADC to allow decoding of the desired radio channel. Optionally, the algorithm can also scale the amplification of preceding stages prior to the analog-to-digital conversion and select the correct number of bits for the conversion by the ADC. The overall result leads to a more optimized power consumption of the radio receiver.

The present invention provides for continuously controlling the dynamic range of an ADC by providing to the ADC a control word which represents the dynamic range required of the ADC under current reception conditions. In other words, the control word represents the effective number of bits required of the ADC output in order to provide a sufficient digital signal for post digital signal processing to decode a desired radio channel under existing radio frequency reception conditions. This continuously determined control word representing the current resolution required of the ADC also can provide for sufficient headroom in view of potential signal changes as well as the latency time of the control cycle used to determine the next control word to be applied to the ADC.

The present invention can further provide conventional level shifting of the analog signal to an optimal detection level for presentation to the ADC, with this gain controlled signal combined with repetitive calculation of the optimal dynamic range of the ADC. Finally an alarm signal can be generated in situations where it is determined that the signal levels of the radio frequency signal being received are rapidly changing as sensed by the analog components of an associated radio receiver, which can then be used to reduce the latency of the control algorithm and hence, minimize the required headroom due to fluctuating signal levels.

In short, the present method reduces the required number of reduction bits used by the ADC at any instant in time to an amount necessary for decoding a desired radio channel under current operating conditions. This method allows for the efficient use of high-resolution, dynamically scalable ADCs in radio systems. Through this method, it is possible to reduce the average power consumption of a high-resolution ADC and hence, the radio receiver power consumption.

BRIEF DESCRIPTION OF THE DRAWINGS

For a fuller understanding and the nature of the present invention, reference is made to the following detailed description taken in connection with the following drawings which:

FIGS. 4a, 4b, 4c and 4d show the signal levels and required dynamic range vs. full-scale and full-resolution of an ADC; and in particular: FIG. 4a shows these signal levels for when a received signal is weak and no analog gain control is available; FIG. 4b shows the signal levels when the received signal is strong and no analog gain control is available; FIG. 4c shows the signal levels when the received signal is weak and other radio frequency channels are relatively weak and no analog gain control is available; and FIG. 4d shows the signal levels when the received signal is weak and other radio frequency channels are relatively weak and analog gain control is available;

BEST MODE FOR CARRYING OUT THE INVENTION

Introduction

Radio Receiver 20

The acronyms used throughout the figures and the associated discussions are presented in Table 1.

Figure 1:
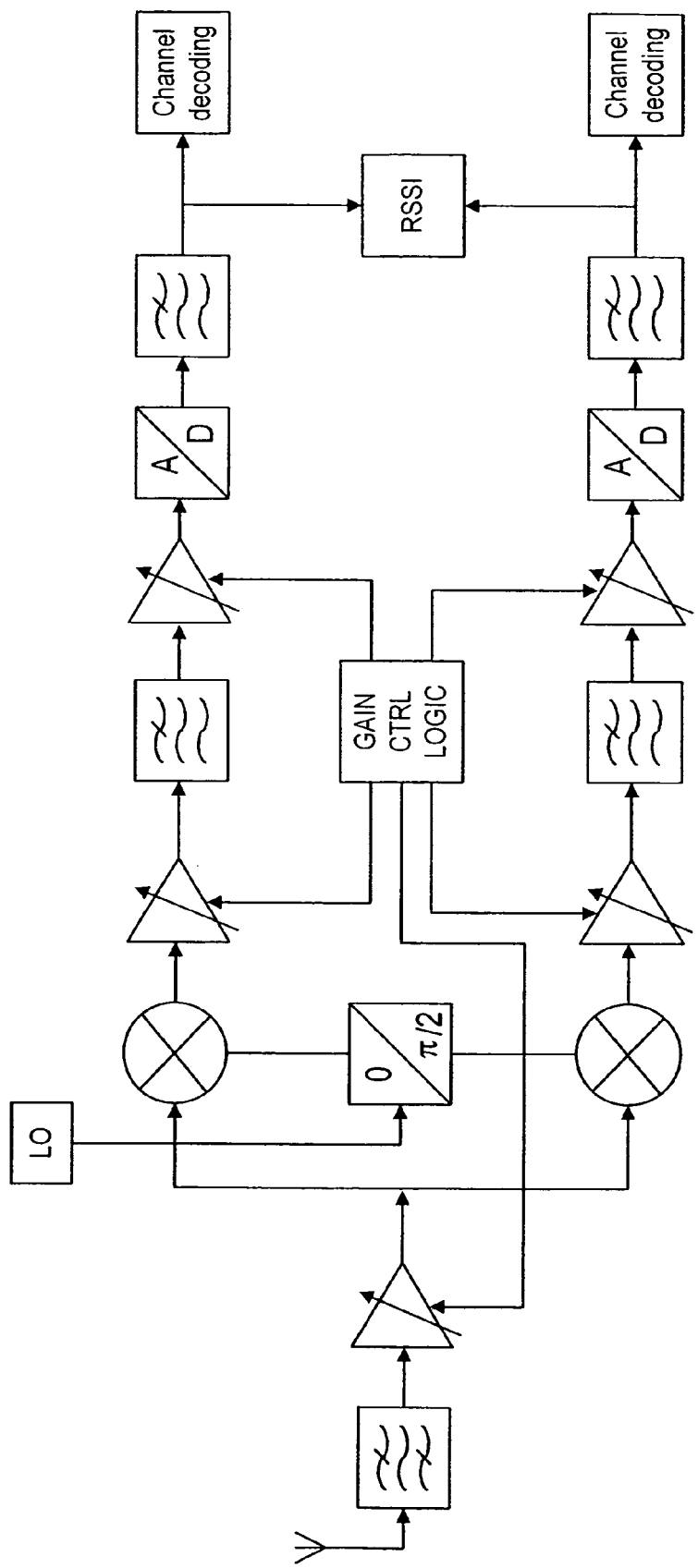
FIG. 1 is a block diagram of a prior art direct conversion receiver with gain control.
Figure 2:
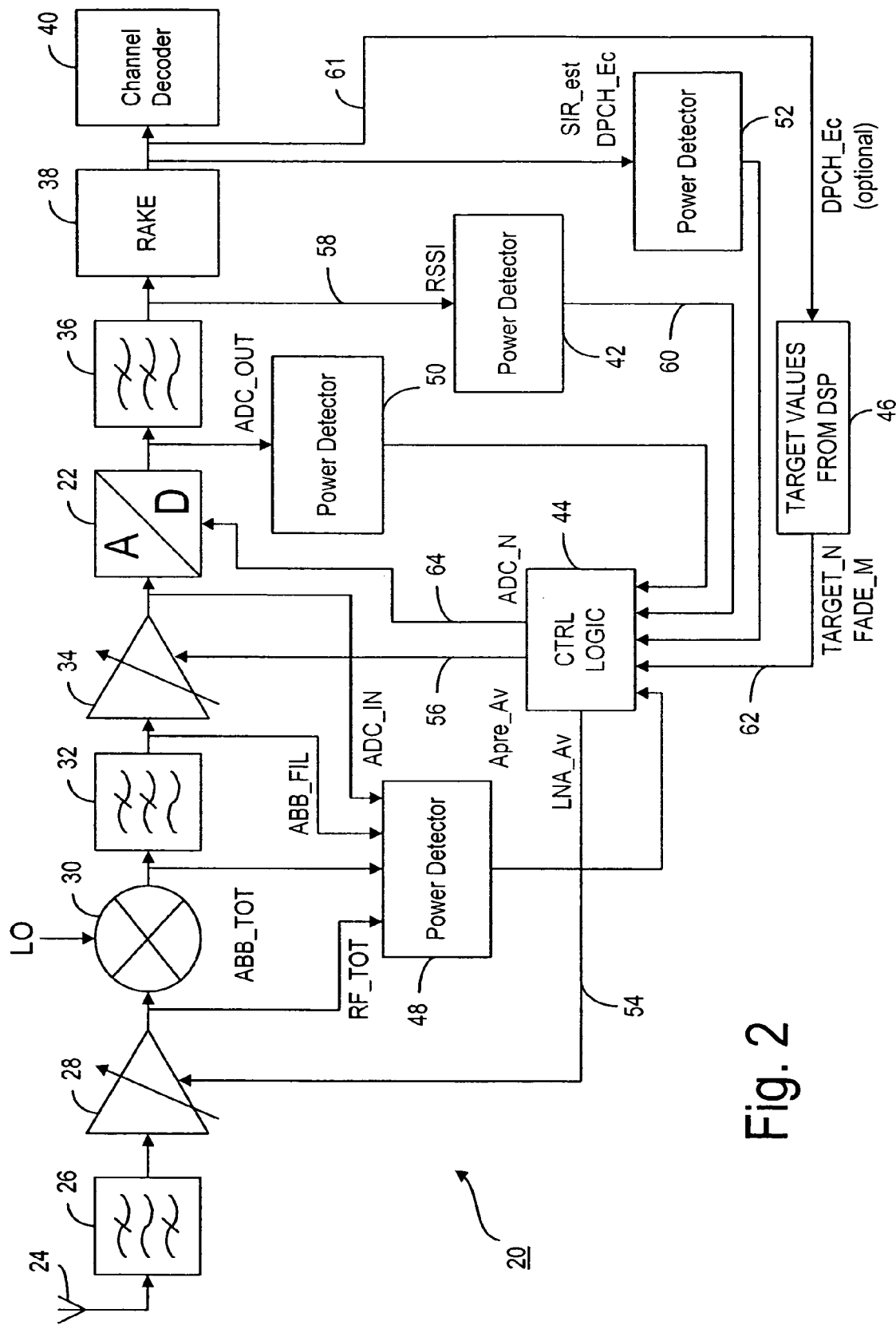
FIG. 2 is a block diagram of a direct conversion receiver with ADC dynamic range control according to the present invention in which the ADC control is associated with one downconverting stage.

FIG. 2 is a block diagram of a radio receiver 20 with an analog-to-digital converter 22 (ADC) having dynamic range control according to the present invention. It shows a radio frequency receiver with a CDMA processing block (RAKE) 38 which is shown separately from other channel decoding functions. CDMA signal processing techniques other than RAKE can also be used in the digital architecture. Radio receiver 20 has one downconverting stage and can have several intermediate frequencies. It digitizes the signal received at antenna 24 from baseband, from any intermediate frequency, or directly from the incoming radio frequency of the associated radio frequency channel. The receiver can have in-phase and quadrature branches similar to the in-phase and quadrature branches shown in FIG. 1, which is block diagram of a conventional direct conversion receiver with associated gain control.

TABLE 1

| ABBREVIATIONS | DESCRIPTION |
|---|---|
| ABB_FIL | total signal power at analog baseband after filtering |
| ABB_TOT | total signal power at analog baseband before filtering |
| ADC | analog-to-digital converter |
| ADC_ALERT | alert value when RSSI is close to the ADC output value |
| ADC_FULL | full scale value or resolution of an ADC |
| ADC_IN | signal level at the input of an ADC |
| ADC_N | number of bits or resolution of an ADC |
| ADC_OUT | signal level at the output of an ADC |
| ADC_OUT_TH | threshold value of acceptable changes in ADC output value |
| ALERT_N | increase in ADC resolution when alert procedure is performed |
| Apre_Av | gain in the amplifier before an ADC (present also the total BB gain if needed) |
| Aprev_Av_max | maximum gain in the amplifier before an ADC |
| Apre_step | gain step of the amplifier before an ADC |
| ASIC | application specific integrated circuit |
| BB | baseband |
| BER | bit error rate |
| BLER | block error rate |
| CDMA | code division multiple access |
| CPU | central processing unit |
| DECODE_DPCH | dynamic range (or resolution) needed for decoding a modulated channel. In CDMA systems means unspreaded information |
| DPCH | dedicated physical channel. Term refers to WCDMA system terminology but here it can be considered generally as a single code channel in any CDMA system |
| DPCH_Ec | level of the received code channel in CDMA reception |
| DSP | digital signal processing |
| FADE_M | fading margin |
| IF | intermediate frequency |
| LNA | low noise amplifier |
| LNA_Av | gain of an LNA (presents also the total RF gain if needed) |
| LNA_step | gain step of the LNA |
| LNA_TH_max | threshold for maximum gain value selection in LNA |
| LNA_TH_min | threshold for minimum gain value selection in ADC |
| LO | local oscillator |
| Node_alert | amount of the signal change in the test node, which causes alert process |
| QoS | quality of service. In digital communications literature, QoS can have different meanings at different abstraction levels. Here QoS stands for the received signal quality with respect to data rate, spreading factor (only CDMA), SNR requirement and BER or BLER requirement. |
| RF | radio frequency |
| RF_TOT | total signal power at radio frequency |
| RSSI | received signal strength indicator (or its value) |
| RSSI_TARGET | exchangeable target level to which the current RSSI measurement is compared |
| RSSI_TH | threshold value for changes in RSSI value |
| SIR | signal-to-interference ratio |
| SIR_est | estimate of the current SIR in the reception |
| SIR_min | minimum acceptable SIR in the reception |
| SNR | signal-to-noise ratio |

TABLE 1-continued

| ABBREVIATIONS | DESCRIPTION |
|---|---|
| TARGET_N | target number of bits or resolution for decoding (including despreading) the received radio channel |
| Test_node | selected test node from which signal level is measured or its value |
| T1, T2, T3, T4 | delays |

The Method

The method of the present invention is able to scale the high resolution ADC to the minimum number of bits (minimum dynamic range) required for decoding of the signal received from antenna 24 in view of the current radio receiving conditions. Most of the blocks shown in FIG. 2 are conventional to a direct conversion receiver, including the power detector blocks 42, 48, 50 and 52, and with the exception of the control logic block 44 and the block 46 associated with values from the digital signal processor, in addition to the high resolution ADC 22. All of the blocks are identified in Table 2.

TABLE 2

| Reference Number | Description |
|---|---|
| 22 | analog-to-digital converter |
| 24 | antenna |
| 26 | filter |
| 28 | RF amplifier (LNA) |
| 30 | mixer |
| 32 | filter |
| 34 | baseband amplifier |
| 36 | filter |
| 38 | CDMA processing block (RAKE for instance) |
| 40 | channel decoder |
| 42 | power detector |
| 44 | control logic |
| 46 | target values from digital signal processor |
| 48 | power detector |
| 50 | power detector |
| 52 | power detector |

The block diagram of the radio receiver shown in FIG. 2 does not require automatic gain control if the ADC 22 has sufficiently high resolution for receiving the desired radio channel under adverse receiving conditions. Thus a high resolution is needed for weak radio channels even in the case where no large interfering channels are present. As will be explained below, the present invention can accommodate automatic gain control so as to control the gain of associated analog variable amplifiers 28 and 34 via control lines 54 and 56. The analog gain control scheme can be used to amplify weak signals more when relatively little power exists at other nearby radio channels so as to be able to scale down the resolution of the ADC and thus further reduce power consumption. These concepts will be described more fully below.

ADC Resolution Control without Analog Gain Control

Solid lines 58, 60, 62 and 64 in FIG. 2 represent the repetitive control of the dynamic range of the ADC without associated automatic gain control. In this embodiment, the target value from the digital signal processor represents the number of bits (or the dynamic resolution) required for decoding the radio channel at channel decoder 40 when other radio channels are filtered out (no interference) and the signal level at the input of a detector is correct. This target value is called TARGET_N. This number can be fixed and based upon the type of decoding to be performed or this number can be determined according to the specific mode in which the receiver is operating at some time or it can change during reception if the required value can be reevaluated according to existing conditions and service quality requirements. Thus for example in a typical CDMA system, the required resolution for ADC 22 would be four to six bits. The received signal strength (RSSI) of the received radio channel is then measured and the required-resolution calculated in a manner shown in FIG. 3 with typical signal levels and required dynamic range vs. full-scale (full-resolution) of the ADC.

Figure 3:
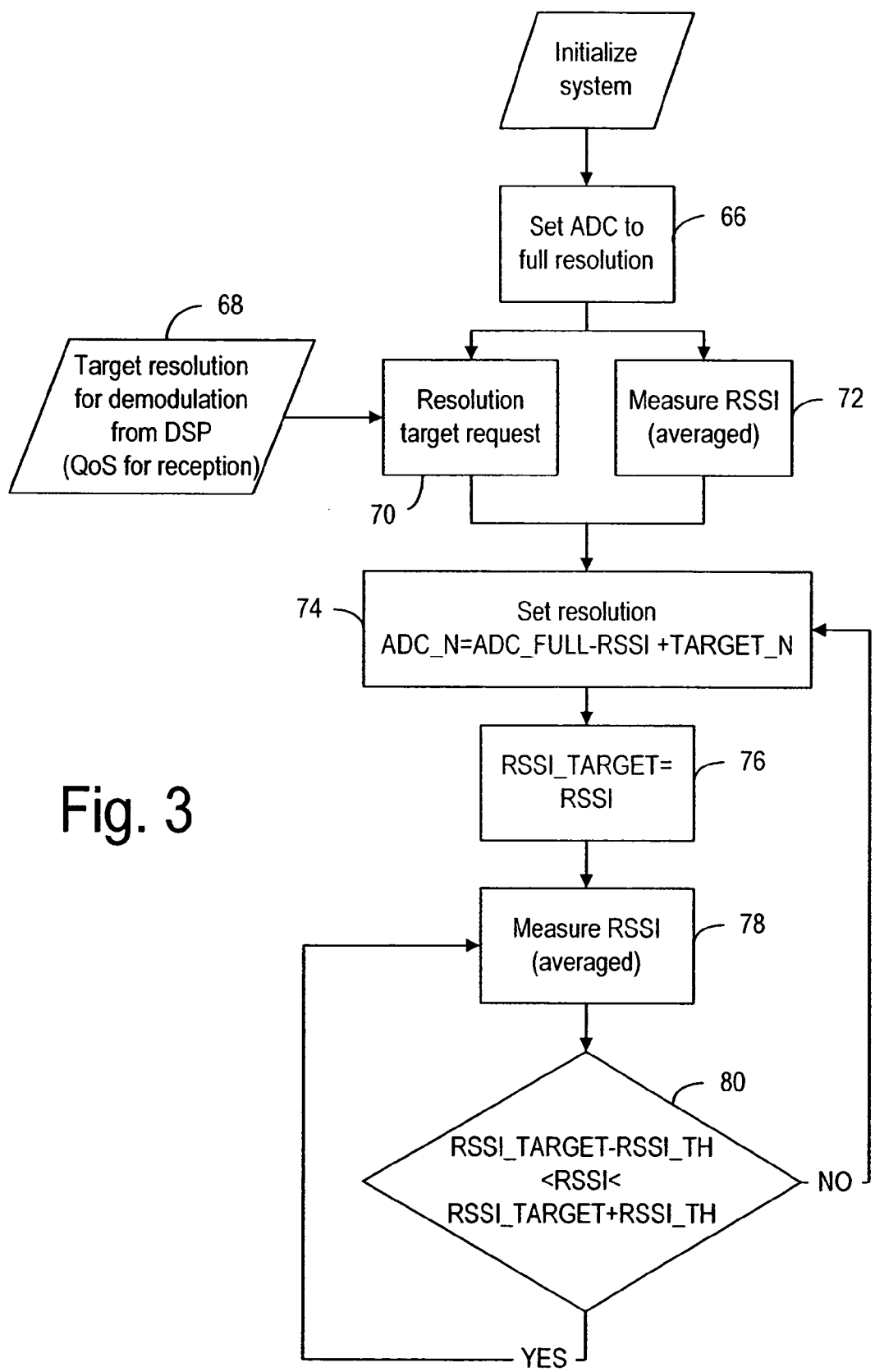
FIG. 3 is a flow chart showing how ADC resolution is determined when analog gain control is not used in conjunction with the determination of ADC resolution.
Figure 4:
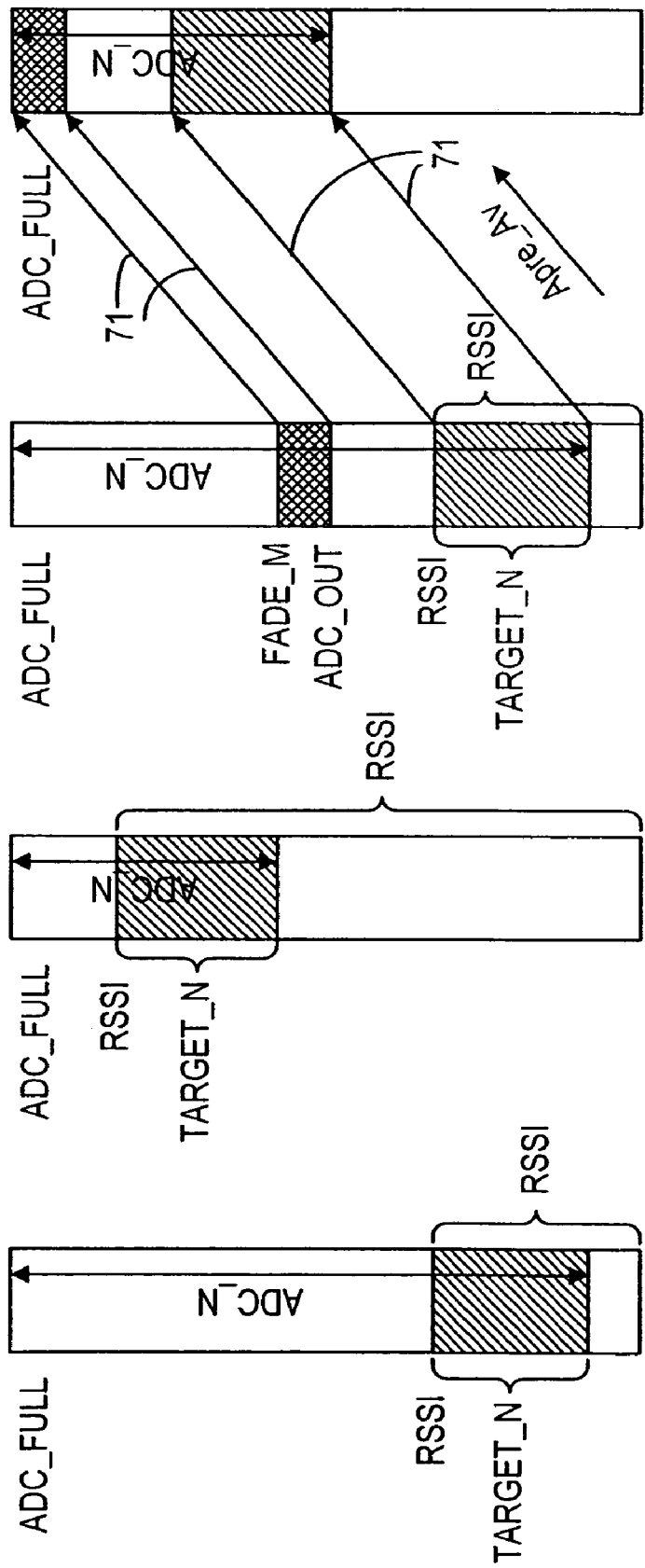
FIG. 4 comprising

FIGS. 4a, 4b, 4c illustrate various situations regarding ADC resolution calculation and will be described more fully below. The received signal strength RSSI is continuously measured by power detector 42 and if the value goes above or below a certain threshold value, the required resolution (number of bits) for the ADC is recalculated by control logic 44 and presented to the ADC via control line 64. In most situations it is necessary to average all of the measured signals so as to prevent reaction of the control to the normal ripple found in modulated signals or sources of distortion or noise. This is shown and explained in FIG. 3 for the situation in which automatic gain control is not used.

Referring again to FIG. 3, the method for continuously controlling the dynamic range of the ADC is shown in a situation where analog gain control is not used. As shown there, after system initialization, the ADC is set to full-resolution and the target resolution for demodulation is received from the digital signal processor. It is noted that quality of service (QoS) with respect to BER and SNR requirements can be used for purposes of determining the target resolution for demodulation. The target resolution for the ADC (TARGET_N) is thus presented to the resolution target request step 70 and at the same time the received signal strength (RSSI) is measured (and typically averaged) at step 72. The results of steps 70 and 72 are presented to the actual resolution determination step 74. It is there seen that the current or instantaneous resolution of the ADC 22 is determined by the equation ADC_N=ADC_FULL−RSSI+TARGET_N, where ADC_N represents a number of bits (or dynamic resolution) of the ADC under current operating conditions.

It should be noted that in FIG. 3 with respect to the calculation of ADC_N, the values for ADC_FULL, as well as received signal strength (RSSI) can be calculated in decibels or in bits. For the equation set forth in step 74, if the value of TARGET_N is in bits, then ADC_FULL and RSSI would also be set forth in bits. A well-known formula which calculates the relationship between the number of bits and dynamic range is:

$$DR=SNR=6.02*m+1.76 \text{ dB};$$

where DR is the dynamic range requirement and m is the total number of bits of resolution for the ADC.

Other formulas can be used as well in order to define the required number of bits from the dynamic range. The final number of bits for ADC_N can then be defined as $$ADC\_N=m+TARGET\_N, \text{ or}$$

$$ADC\_N=(ADC\_FULL-RSSI-1.76 \text{ dB})/6.02+TARGET\_N.$$

In the latter equation ADC_FULL and RSSI are given in decibels and ADC_N and TARGET_N in bits. Thus the derivation of the equation as set forth in step 74 is readily apparent.

FIG. 4a shows that when the received signal strength is low, the number of bits (ADC_N) to be used by ADC 22 is relatively large and is only somewhat less than the maximum resolution of the ADC as set forth by variable ADC_FULL. FIG. 4b shows the same situation in which the received signal strength is large, representing a good incoming signal and therefore the value of ADC_N is only slightly greater than the value of TARGET_N.

Referring again to FIG. 3, after the value of ADC_N is determined, module 76 sets the variable RSSI_TARGET to be equal to the current received signal strength RSSI. Then RSSI is again measured and averaged at step 78. Decisional block 80 determines if RSSI_TARGET minus the RSSI threshold (RSSI_TH) is less than the current measurement of RSSI as determined by step 78 and further if the current value of RSSI is less than the target value plus the RSSI threshold. If the result of the decisional block is true, the RSSI value is again measured and averaged (return to step 78), otherwise the resolution is again determined (return to step 74).

Although measured RSSI and the predetermined target resolution (TARGET_N) are the main parameters calculated as shown in step 74, in order to determine the required resolution of the ADC there are other parameters that can be used to determine the dynamic range and therefore bit resolution for the ADC, including estimating signal-to-interference ratio (SIR) and received power of the desired CDMA channel (DPCH_Ec) so as to improve the accuracy of the calculation. These additional parameters are shown in FIG. 2 via power detector 52 with the information presented to control logic modulator 44. In addition, parameters such as the power of the desired CDMA channel (DPCH_Ec) can be used to assist in the estimation of the required number of bits (TARGET_N) needed in CDMA systems for presentation to control logic. (optional line 61).

The following examples describe how the additional parameters can be used to assist in carrying out the method. However, other equations or methods based on these parameters can be used. Instead of RSSI, the required resolution for ADC can be calculated in CDMA systems based on the power of the received code channel after despreading. Hence the ADC resolution is given as:

$$ADC\_N=ADC\_FULL-DPCH\_Ec+DECODE\_DPCH;$$

where DECODE_DPCH describes the required number of bits needed to decode the received information after despreading.

Code channel power can be also used to define the target resolution (TARGET_N) based on the received information. Then the dynamic range needed for decoding can be expressed as;

$$DR=RSSI-DPCH\_Ec+DECODE\_DPCH.$$

TARGET_N can be defined in bits from the dynamic range as described earlier. The SIR estimate can be used in order to avoid loss of the information due to too high quantization noise in the receiver. If SIR estimate (SIR_est) is smaller than minimum acceptable SIR (SIR_min) the number of bits in the ADC can be increased by one or more bits such as;

$$ADC\_N(n)=ADC\_N(n-1)+1 \text{ or}$$

$$ADC\_N(n)=ADC\_N(n-1)+ALERT\_N.$$

This logic can be operated independently on the other algorithms and hence it can react faster to rapid changes. In most cases some averaging will be needed when DPCH_Ec or SIR_est is defined.

ADC Determination with Gain Control

Background

Figure 5:
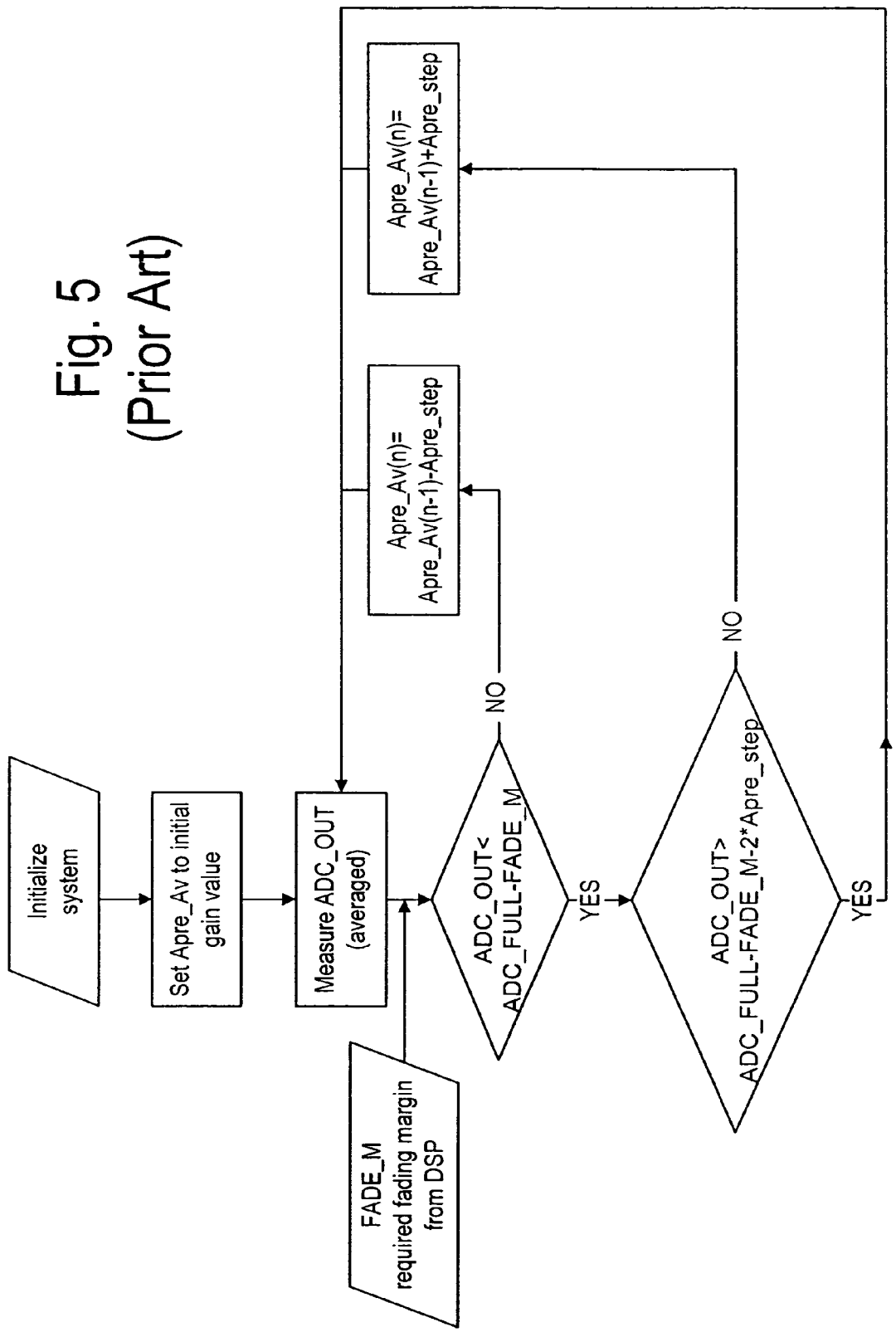
FIG. 5 is an example of a flow chart of a prior art level adjustment used for analog gain control.

FIG. 5 shows a conventional analog gain control scheme which is used in many digital radio communication systems in order to optimize the level of the incoming radio frequency signal at the input of the analog-to-digital converter so as to be at a level which is best for ultimate detection. The methodology of FIG. 5 can be applied to the current method for continuously controlling the dynamic range of the ADC by means of the flow chart set forth in FIG. 6. As there seen, the signal level at the output of the ADC (ADC_OUT) is measured at step 82 such as by power detector 50 shown in FIG. 2. If gain control is performed, the gain in the (Aprev_Av) analog amplifier or amplifiers before the ADC is determined at step 84. This gain is then presented to the amplifier 34 as shown in FIG. 2 via line 56. A similar amplification value can be determined for a low noise (RF) amplifier 28 by control logic 44 as presented to the LNA via control line 54. This is described more fully below with respect to FIG. 8.

Implementation

Figure 6:
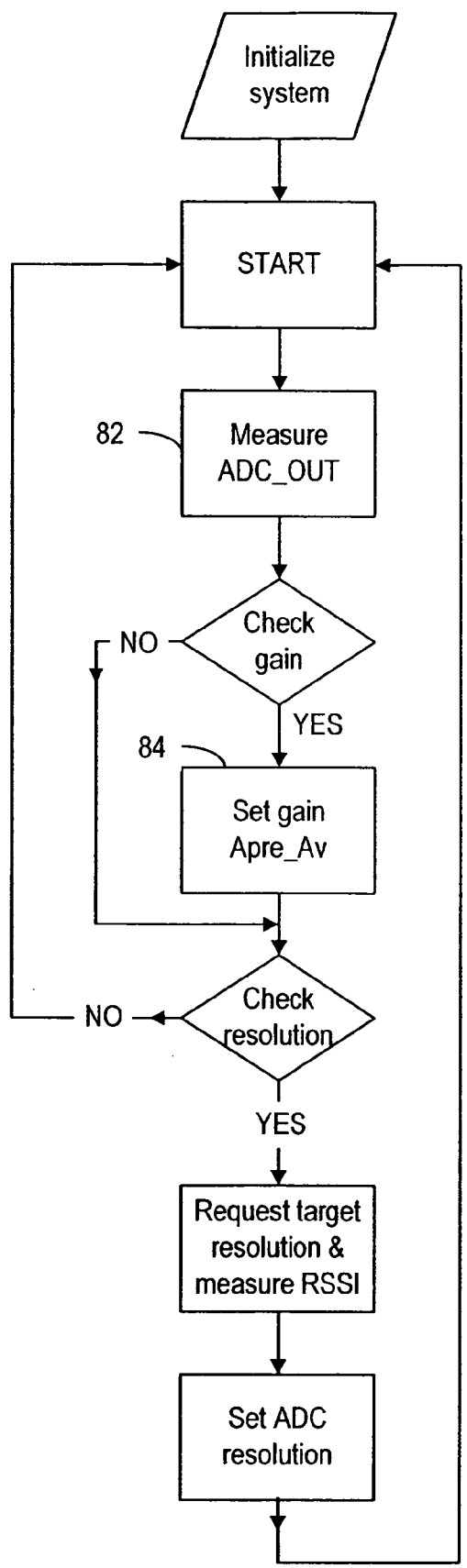
FIG. 6 is a flow chart illustrating ADC resolution control according to the present invention combined with analog gain control level adjustment.

FIG. 6 shows that the remaining steps for performing the determination of ADC_N are similar to those in FIG. 3. Thus FIG. 6 represents an analog baseband gain control which is added to the resolution scaling method presented in FIG. 3. The overall result is seen as a reduction in the bit resolution for the ADC as seen in FIG. 4d. The lines 71 between FIG. 4c and FIG. 4d qualitatively show this reduction in ADC_N for the same reception conditions.

Figure 7B:
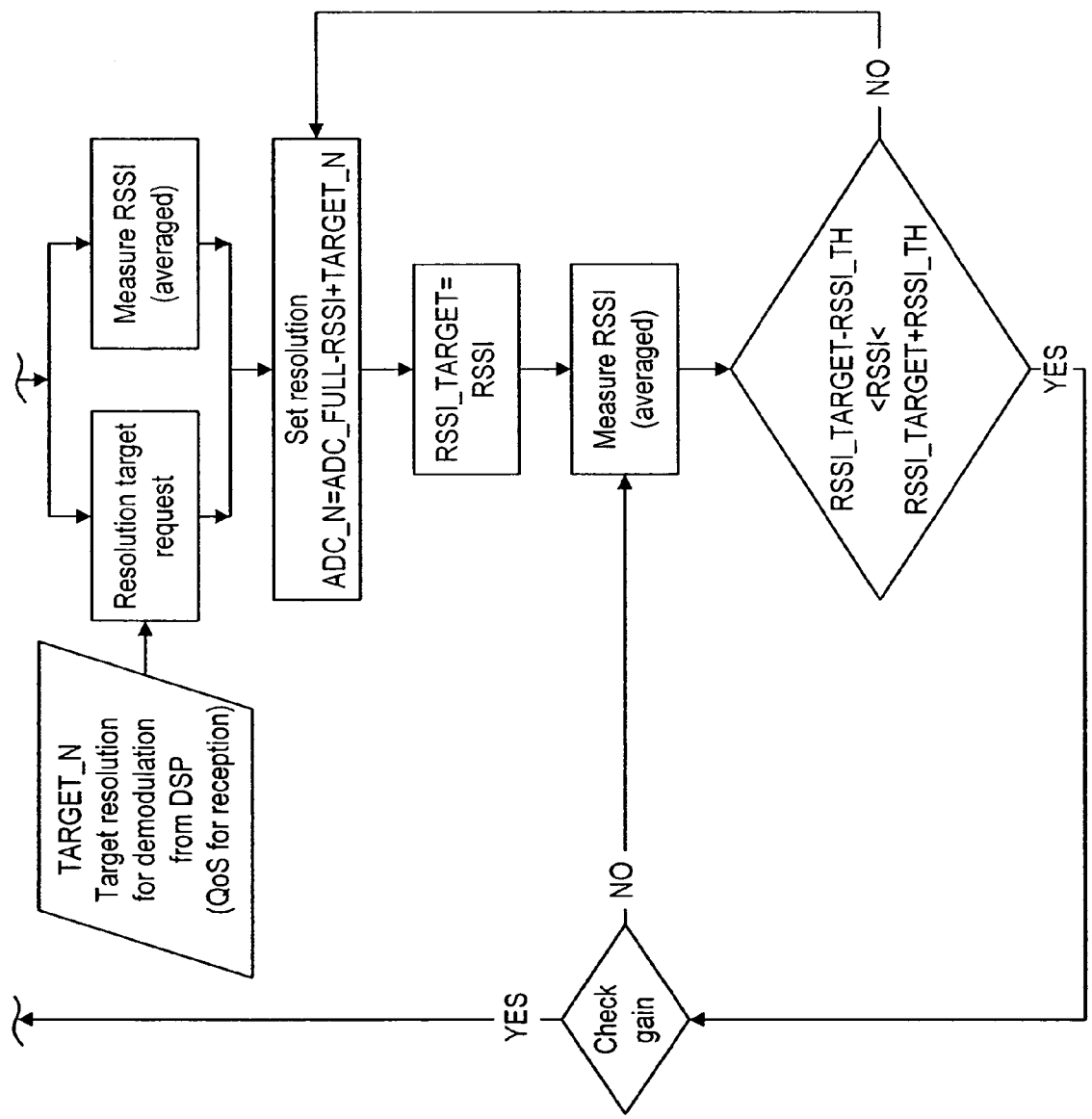
FIG. 7 comprising FIG. 7a and FIG. 7b is a more detailed flow chart which defines how ADC resolution is determined when analog gain control is also used.

FIG. 7 is a flow chart to define the ADC resolution with analog gain control which is more detailed than the flow chart shown in FIG. 6. Details are presented in FIG. 7 for use of the fading margin (FADE_M) and the gain steps associated with amplifier 34 (Apre_step) so as to determine a new value of the amplifier gain (Apre_Av) as shown by steps 88 and 90, depending upon conditional modules 92 and 94 respectively. The lower portion of FIG. 7 with respect to determining the current resolution to be used by the ADC (ADC_N) is basically similar to that shown in FIG. 3.

As can be seen in FIGS. 6 and 7, initially the input level of the ADC is adjusted by adjusting the amplifier gain (Apre_Av) to an optimal level for presentation of the analog signal to the ADC. The fading margin (FADE_M) can be fixed or defined separately with respect to each mode of operation of the receiver. It also can be adjusted during radio channel reception. After the input signal level adjustment, the resolution of the ADC is chosen based upon measured RSSI or ADC_OUT and used in conjunction with the target resolution (TARGET_N) to determine an amount needed for signal detection at the channel decoder 40 (see FIG. 2). The same method as shown in FIG. 3 can be used. Using this method, the ADC resolution can be scaled down compared to implementations without high gain control. In this respect, FIG. 4d is an illustration when the received radio channel signal is weak and other channels are relatively weak with automatic gain control. A comparison of FIG. 4c to FIG. 4d shows that the reduction in ADC resolution as defined by ADC_N is a direct factor based upon the determined gain Apre_Av for use by amplifier 34.

Figure 8:
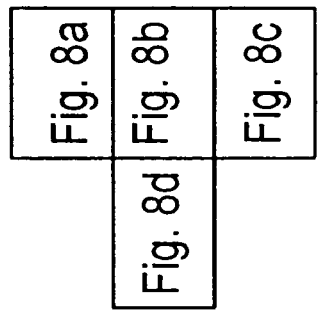
FIG. 8 comprising FIG. 8a, FIG. 8b, FIG. 8c
Figure 8A:
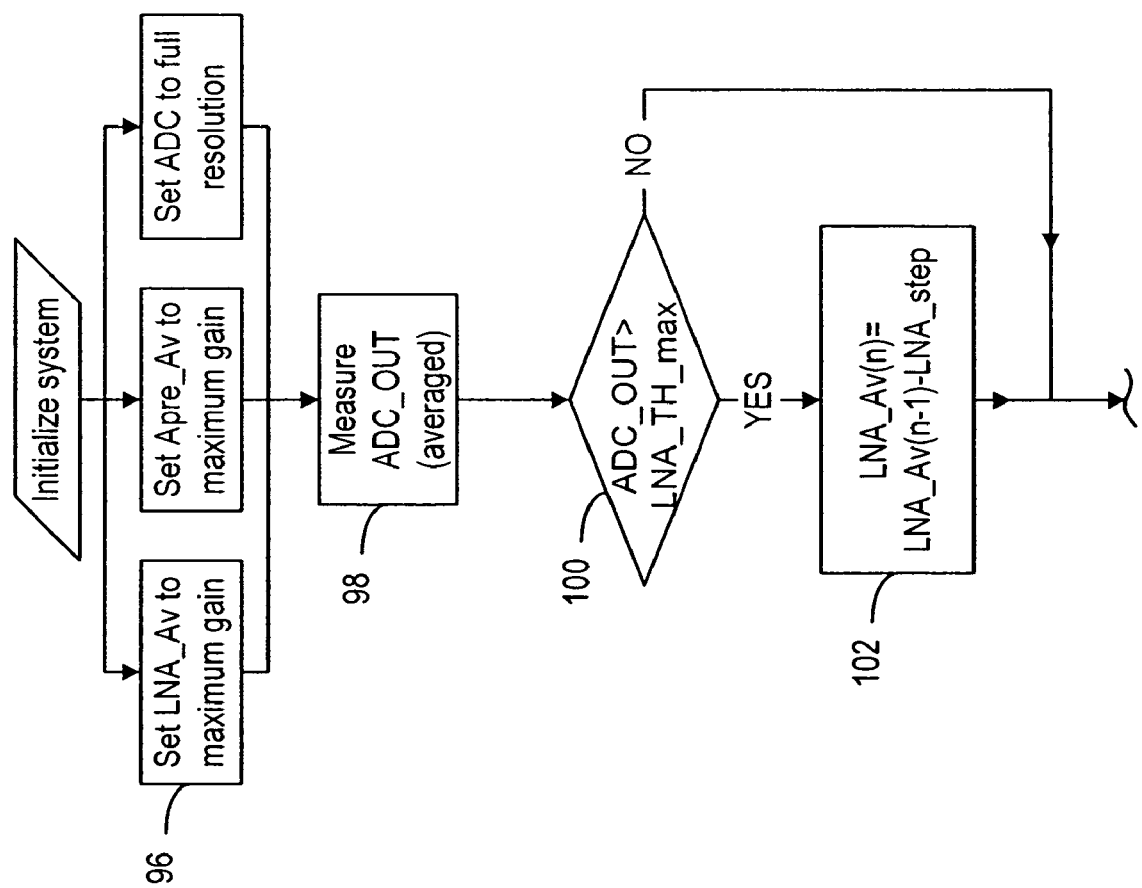
FIG. 8d is a flow chart of an algorithm example which defines ADC resolution with analog gain control and RF gain control with the radio frequency gain control added to the algorithm shown in FIG. 7.
Figure 8B:
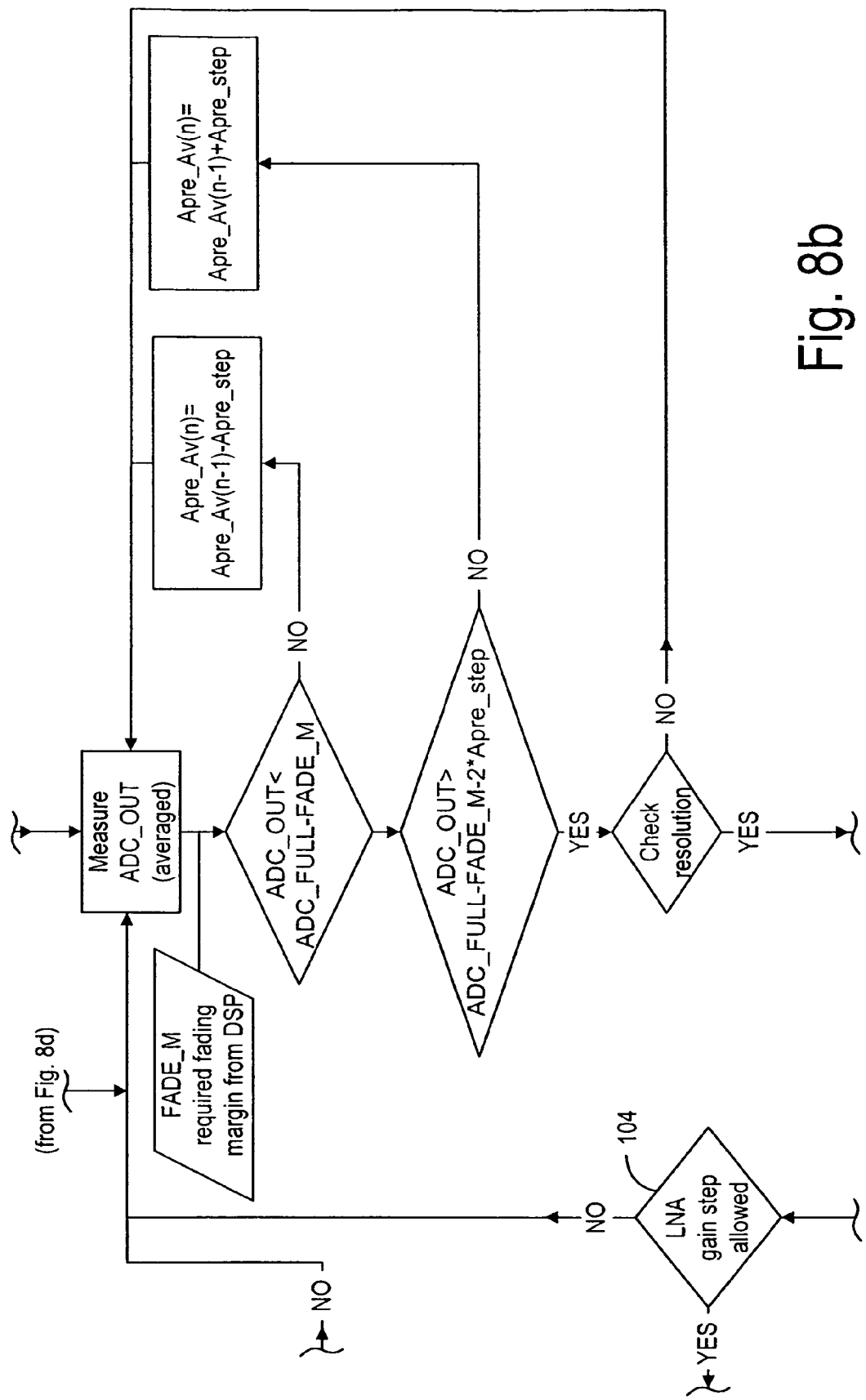
Figure 8C:
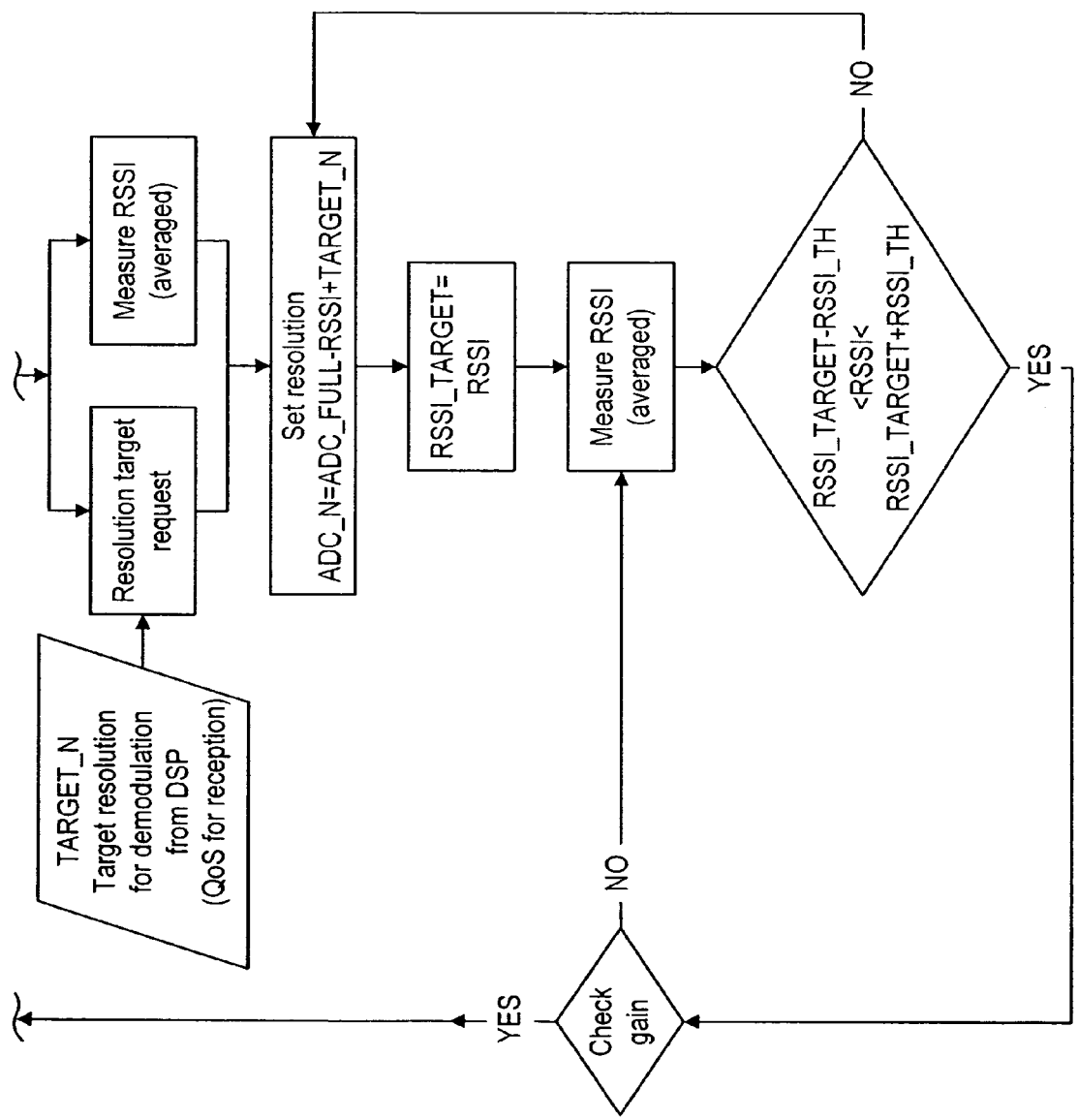
Figure 8D:
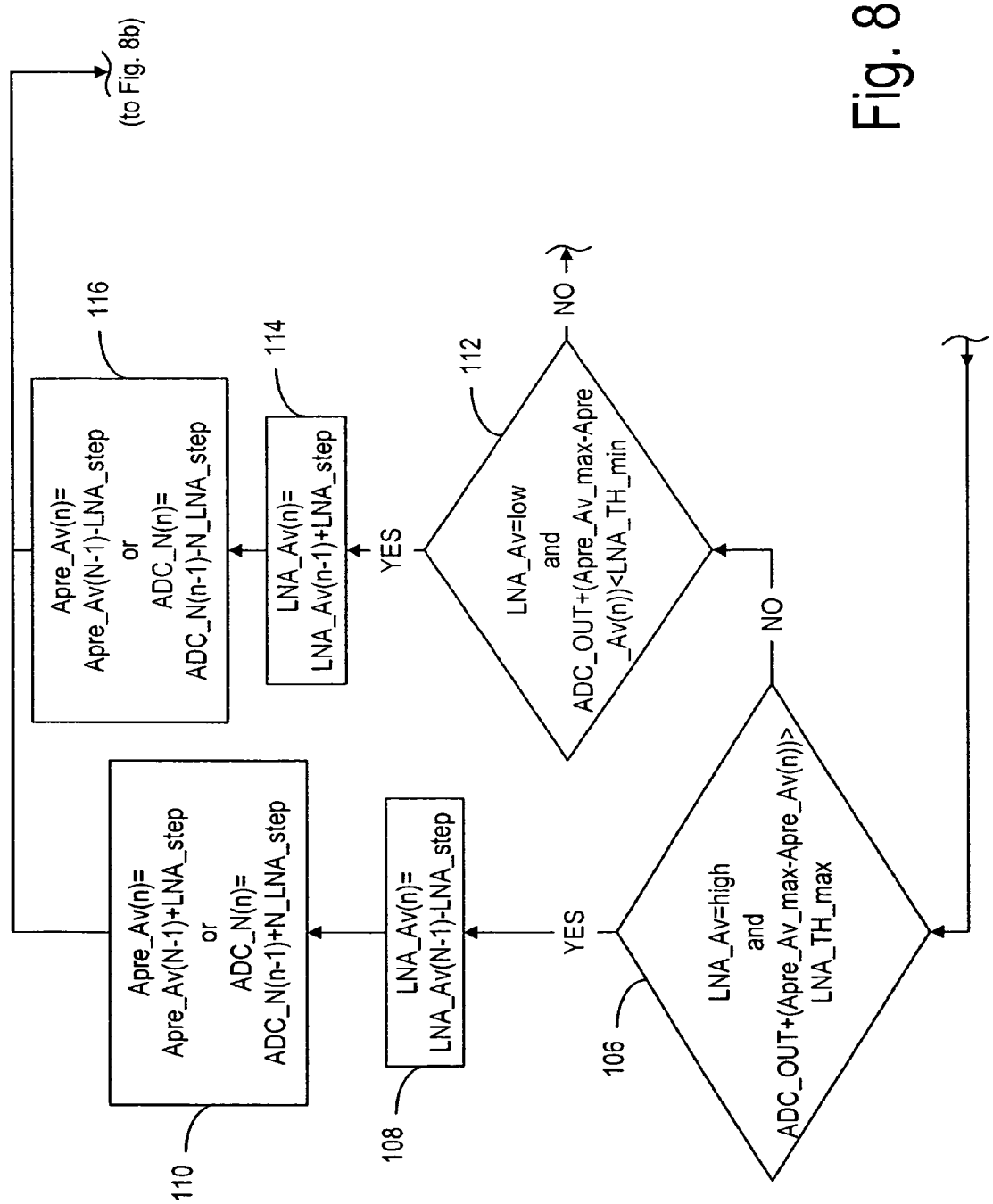

A radio frequency (RF) gain step is also used in many radio receivers. FIG. 8 shows the flow chart associated with one embodiment of the present invention wherein the large gain step typical in RF circuitry is adopted for use by the ADC resolution control method according to the present invention. It should be noted that rather than the gain step being at the RF stage, it can also be performed at some intermediate frequency or at baseband stage and the same procedure can be applied in all these cases as well. The RF gain can be adjusted with smaller steps and all possible analog gain control schemes can be applied to the ADC resolution scaling method in a similar manner as presented here. It may be preferable to use RF gain control and eliminate analog baseband gain control as well, depending upon the particular application of the radio receiver. The same principle without baseband gain control as in FIG. 8 can then be used. The control logic particular to the RF gain control is shown in steps 96, 98, 100, 102, 104, 106, 108, 110, 112, 114 and 116. The signal LNA_Av(n) is generated by control logic 44 shown in FIG. 2 and presented via line 54 to the RF or low noise amplifier 28. The remaining flow steps shown in FIG. 8 are similar to those shown in FIGS. 3, 6 and 7.

Figure 9:
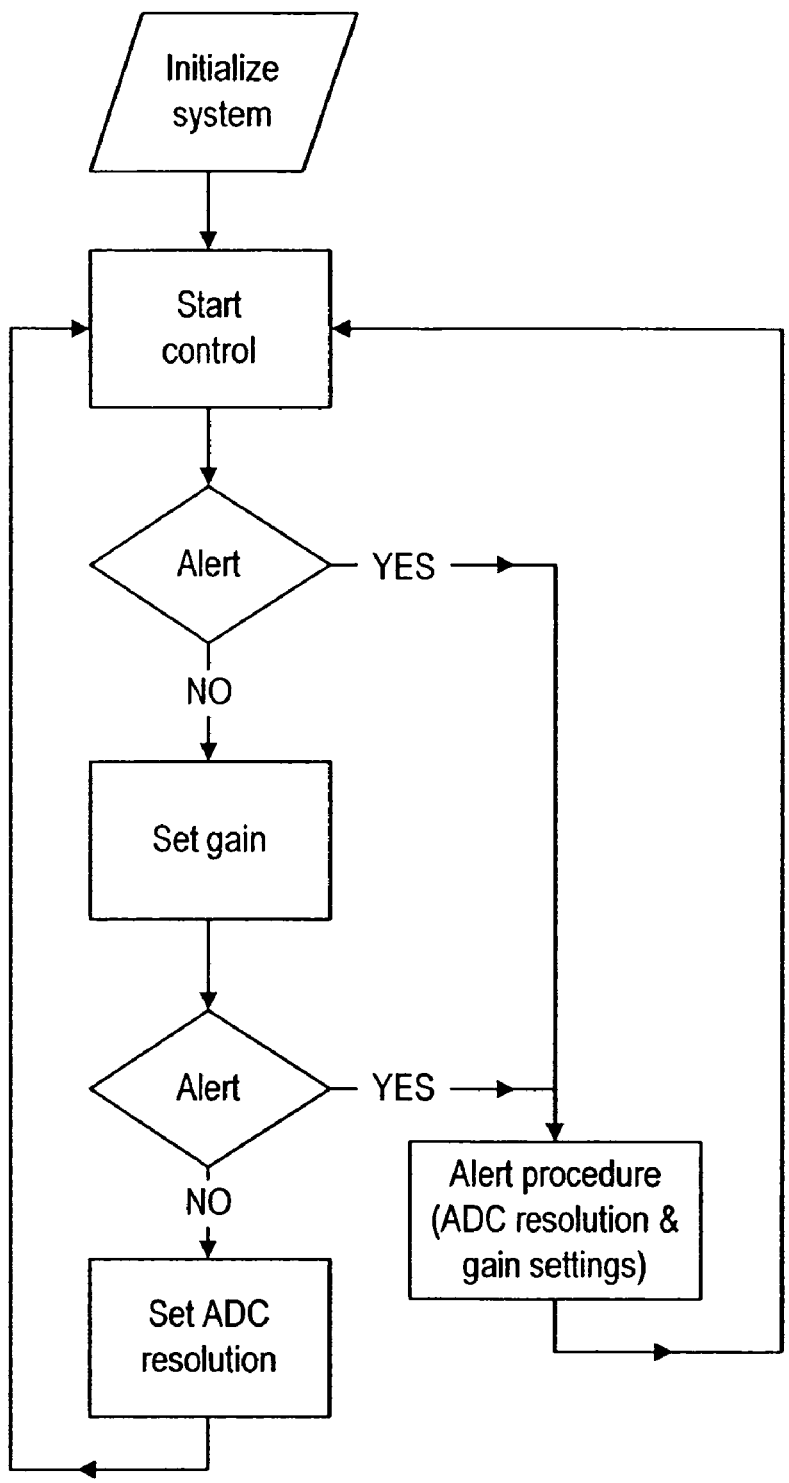
FIG. 9 is a flow chart which shows analog alert signal generation which can be used in situations where fast changes in signal levels are determined.
Figure 10:
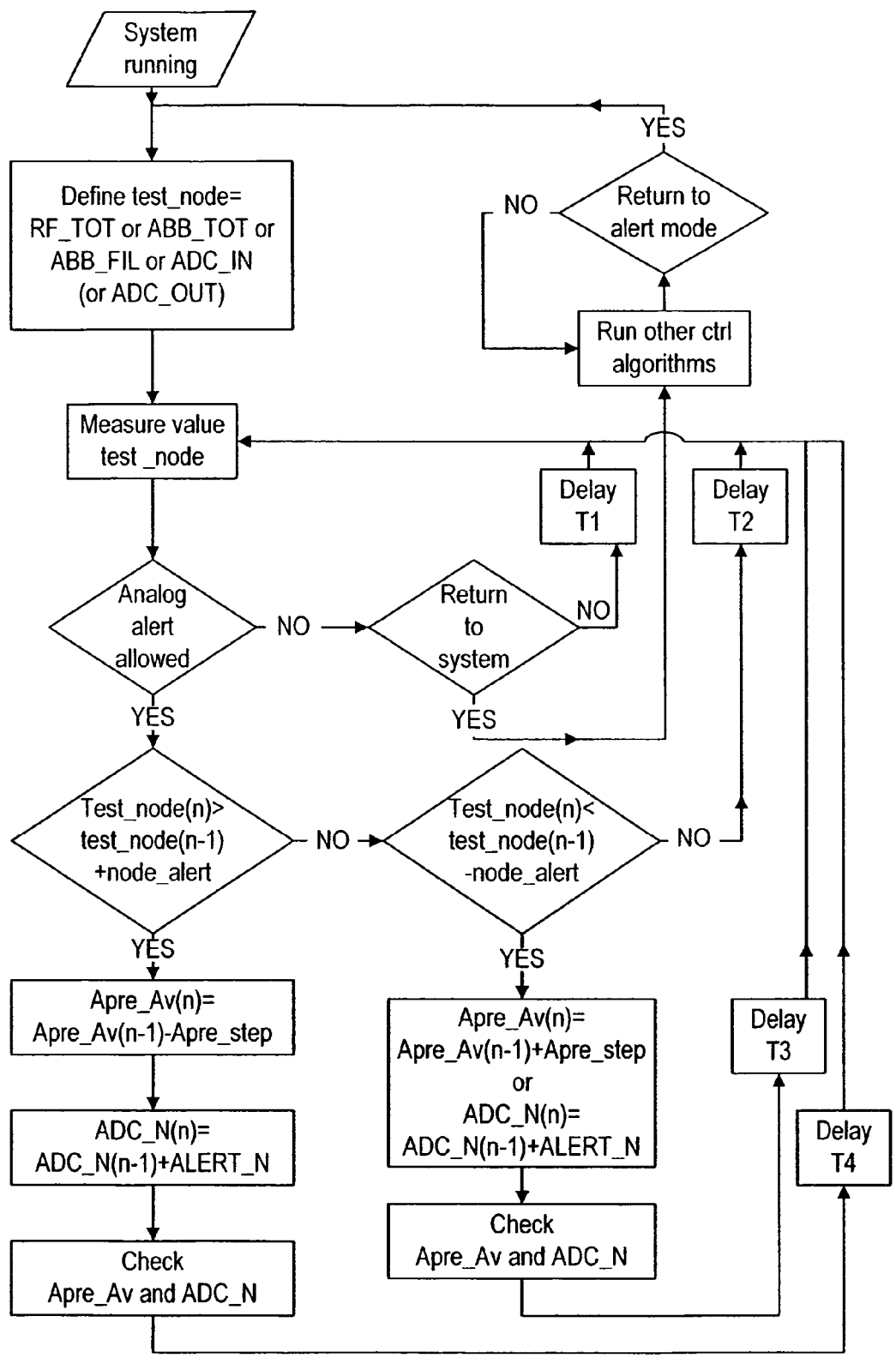
FIG. 10 is a flow chart similar to FIG. 8 which includes alert signal generation that is used to redetermine ADC resolution and gain.

In addition to determining on a repetitive basis the optimal dynamic range of the ADC, the present invention can also generate an analog alert based upon measurements of received signal level fluctuations from an arbitrarily chosen test node. The overall principle of the analog alert is seen in FIG. 9. A specific example of an analog alert in combination with the continuous control of the dynamic range of ADC is presented in FIG. 10. As seen in FIG. 10, either the resolution of the ADC as set by the method (ADC_N) or the gain of the amplifier 34 (Apre_Av), or both of these parameters, can be modified based on the measurement of the test node. These values can be repetitively updated until an alert condition is not detected. Such a procedure reduces the latency associated with determination of ADC_N and gain when rapidly varying signal conditions are detected. In addition, the gain at the RF amplifier 28 (see FIG. 2) or at any intermediate frequency can be modified if an analog alert is determined. The delay elements T1, T2, T3 and T4 seen in FIG. 10 are used to unify the time difference between measured samples. Otherwise, each of the feedbacks may have different latencies which would cause non-unified measurement conditions. The alert process as shown in FIG. 10 can be adapted to any of the previously defined algorithms such as seen in FIGS. 3, 6, 7 and 8. The alert process thus reduces latency in the determination of ADC_N when rapidly changing signal conditions are detected.

For a radio receiver incorporating the methodology of the present invention, the implementation of the method for continuously controlling the dynamic range of the ADC can be performed with customized digital logic on the same chip in which the ADC is fabricated. This chip may be located on the same die with other RF parts or with the digital ASIC. Furthermore, the algorithms performed, including those for calculating the dynamic range for the ADC, may be programmed into a digital signal processor and the measured data collected from other chips through busses connected to the DSP engine. Of course, a central processing unit can perform the calculations required by the method as well. For speed purposes, customized digital logic would normally be the preferred method of implementation.

Thus what has been described is a method for continuously determining the required dynamic range for an analog-to-digital converter by determining the received signal strength in combination with the overall dynamic range for the ADC in combination with the target resolution of the ADC based upon the type of decoding to be performed subsequent to analog-to-digital conversion. The method thereby allows for a reduction in power consumption associated with the ADC, especially when the incoming signal is being received with few interfering radio channels and with a relatively high signal strength. Furthermore, the present method can be combined with analog gain control, as well as RF or IF gain control so as to further reduce the dynamic range necessary for decoding a received radio channel and thereby minimizing power consumption for these portions of a direct conversion radio receiver or any other receiver architecture. An alarm alert can be used to reduce the latency of ADC resolution calculation when rapidly fluctuating signal conditions are sensed. The method and apparatus for performing same are set forth and described herein above.

Having described the invention, what is claimed is:

1. An apparatus comprising:
an analog-to-digital converter configured to convert at an operating resolution a signal associated with a radio channel into a digital output signal;
a detector in communication with a signal associated with the digital output signal configured to measure a received signal parameter of said radio channel; and
control logic configured to determine the operating resolution based on a full-scale resolution of the analog-to-digital converter, a target resolution, and said received signal parameter, wherein the target resolution is the resolution necessary to decode said radio channel assuming no interference from potentially interfering radio channels.

2. The apparatus as defined in claim 1, wherein the control logic is configured to repetitively determine the operating resolution.

3. The apparatus as defined in claim 2, wherein the control logic is configured to determine the operating resolution to be said full-scale resolution of the analog-to-digital converter less said received signal parameter of said radio channel plus said target resolution.

4. The apparatus as defined in claim 1, wherein the control logic is configured to repetitively determine the operating resolution if the received signal parameter is outside of limits specified for the measurement of said received signal parameter.

5. The apparatus as defined in claim 4, wherein the control logic is configured to determine if said signal as sensed at a test node is changing faster than a predetermined amount, and if true is configured to modify the repetitive determination of the operating resolution.

6. The apparatus of claim 5, wherein the test node is at the output of the analog-to-digital converter.

7. The apparatus of claim 4, wherein said limits are based upon a threshold value.

8. The apparatus of claim 4, wherein said limits are based on a predetermined threshold value for said received signal parameter.

9. The apparatus of claim 4, wherein the control logic is configured to repetitively update the measured received signal parameter if the received signal parameter is within said limits.

10. The apparatus as defined in claim 1, further comprising at least one amplifier configured to amplify said signal associated with said radio channel prior to presenting the signal to the analog-to-digital converter.

11. The apparatus as defined in claim 10, wherein a second detector is configured to measure said digital output signal of the analog-to-digital converter.

12. The apparatus as defined in claim 11, wherein said signal associated with said radio channel is a signal in a radio frequency domain, wherein said at least one amplifier includes a radio frequency amplifier for amplifying said signal while in the radio frequency domain.

13. The apparatus of claim 12, wherein the radio frequency amplifier has an adjustable gain and wherein said control logic is configured to adjust said adjustable gain at least based on said digital output signal of said analog-to-digital converter.

14. The apparatus of claim 10, wherein each of said at least one amplifier has an adjustable gain and wherein said control logic is configured to adjust said adjustable gain based on at least said output signal of said analog-to-digital converter.

15. The apparatus of claim 14, wherein the gain of said at least one amplifier is adjustable based on at least said output signal of said analog-to-digital converter, a fading margin and the full-scale resolution of the analog-to-digital converter.

16. The apparatus of claim 14, wherein the control logic is configured to determine if the signal associated with said radio channel as sensed at a test node is changing faster than a predetermined amount over a period of time, and if true, said control logic is configured to modify the adjusting of the gain of at least one of said at least one amplifier.

17. The apparatus of claim 16, wherein the test node is at an output of one of said at least one amplifier or the output of the analog-to-digital converter.

18. The apparatus of claim 10, wherein the control logic is configured to adjust a gain of said at least one amplifier responsive to the digital output signal of said analog-to-digital converter.

19. The apparatus of claim 18, wherein the control logic is configured to adjust the gain of said at least one amplifier by comparison of said digital output signal with a value at least based on said full-scale resolution and another value.

20. The apparatus of claim 19, wherein said another value is at least based upon a fading margin.

21. The apparatus of claim 1, wherein the measured received signal parameter is based on an average of measurements of said received signal parameter.

22. The apparatus as defined in claim 1, wherein said signal associated with said radio channel is a signal in a radio frequency domain, said apparatus further comprising a radio frequency amplifier configured to amplify said signal while in the radio frequency domain.

23. The apparatus of claim 22, wherein said radio frequency amplifier has an adjustable gain and wherein said control logic is configured to adjust said adjustable gain.

24. The apparatus of claim 1, wherein said detector is configured to average the measured received signal parameter of said radio channel.

25. The apparatus of claim 1, wherein said radio channel is a code division multiple access channel conveying a spread spectrum transmission.

26. The apparatus of claim 25, wherein said code division multiple access channel is a wideband code division multiple access channel.

27. The apparatus of claim 25, wherein the detector measures the power of a received code channel after despreading the transmission of said radio channel.

28. The apparatus of claim 25, wherein the target resolution is a number of bits required to decode received information in a received code channel after despreading the transmission of said radio channel.

29. The apparatus of claim 1, comprising a detector configured to estimate a signal-to-interference ratio and wherein the control logic is configured to determine the operating resolution at least based upon said estimated signal-to-interference ratio.

30. The apparatus of claim 29, wherein the control logic is configured to determine if the estimated signal-to-interference ratio is smaller than an acceptable signal-interferenceratio and wherein the determined operating resolution is a number of bits and is increased by at least one bit if said determination is made.

31. The apparatus of claim 30, wherein the increase in the operating resolution is based upon a predetermined number.

32. The apparatus of claim 1, further comprising a radio frequency amplifier configured to amplify a signal while in the radio frequency domain, and a mixer for receipt of the output of the radio frequency amplifier so as to produce said signal associated with a radio channel.

33. The apparatus of claim 32, wherein the apparatus is configured to measure the output of the analog-to-digital converter and wherein the control logic is configured to adjust the gain of the radio frequency amplifier at least when the measured output of the analog-to-digital converter is greater than a first predetermined value or is less than a second value.

34. The apparatus of claim 33, wherein said second value is at least based upon a second predetermined value.

35. The apparatus of claim 1, wherein the signal associated with a radio channel is a code division multiple access signal.

36. The apparatus of claim 1, wherein said received signal parameter is a received signal strength of said radio channel.

37. The apparatus of claim 36, wherein said detector is a power detector.

38. The apparatus of claim 1, wherein said received signal parameter is a signal-to-interference ratio of said radio channel.

39. The apparatus of claim 1, wherein said received signal parameter includes a received power of a code division multiple access channel conveying a spread spectrum transmission.

40. The apparatus of claim 39, wherein said target resolution is at least based on a code channel power.

41. The apparatus of claim 1, wherein said target resolution is at least based on a code channel power of a code division multiple access channel conveying a spread spectrum transmission.

42. The apparatus of claim 1, wherein the apparatus is configured for use in a cellular communication system.

43. The apparatus as defined in claim 1, wherein said detector in communication with said signal associated with said digital output signal is configured so that the measuring of said received signal parameter is such that the detector is configured to determine a first signal parameter based on a signal associated with the digital output signal after filtering and despreading and a second signal parameter based on a signal associated with the digital output signal prior to said filtering, and further wherein said control logic is configured to determine the operating resolution based on said full-scale resolution of the analog-to-digital converter, the target resolution, and said first and second parameters.

44. An apparatus as defined in claim 43, wherein said radio channel is a code division multiple access channel conveying a spread spectrum transmission.

45. The apparatus as defined in claim 43, wherein the target resolution is the number of bits required to decode received information in a received code channel after despreading the transmission of said radio channel.

46. A radio receiver comprising:
an apparatus according to claim 1; and
a decoder in communication with said digital output signal so as to decode the radio channel.

47. The radio receiver as defined in claim 46, wherein the control logic is configured to repetitively determine the operating resolution.

48. A radio receiver as defined in claim 47, wherein the control logic is configured to determine the operating resolution to be said full-scale resolution of the analog-to-digital converter less the received signal parameter of said radio channel plus said target resolution.

49. A radio receiver as defined in claim 46, wherein the control logic is configured to repetitively determine the operating resolution if the received signal parameter is outside of limits specified for the measurement of said received signal parameter.

50. A radio receiver as defined in claim 49, wherein the control logic is configured to determine if the signal associated with said radio channel is changing faster than a predetermined amount, and if true, is configured to modify the repetitive determination of the operating resolution.

51. A radio receiver as defined in claim 46, further comprising at least one amplifier configured to amplify said signal associated with said radio channel prior to presenting the signal to the analog-to-digital converter.

52. A radio receiver as defined in claim 51, wherein said signal associated with said radio channel is a signal in a radio frequency domain, wherein a first amplifier is configured to amplify said signal after said signal has passed through a mixer, and a second amplifier is a radio frequency amplifier configured to amplify said signal while in the radio frequency domain prior to presenting said signal to said mixer.

53. A control module comprising:
a control logic configured to receive a detected value of a signal parameter based on a signal associated with a digital output signal of an analog-to-digital converter and configured to determine an operating resolution of said analog-to-digital converter based on the value of the signal parameter, a full-scale resolution of the analog-to-digital converter, and a target resolution indicative of a resolution necessary to decode a radio channel assuming no interference from potentially interfering radio channels.

54. The control module of claim 53, wherein the control logic is configured to repetitively receive said detected value and to repetitively determine said operating resolution.

55. The control module of claim 53, wherein the control logic is further configured to receive a signal indicative of an output of at least one amplifier associated with the generation of said detected value, and further configured to generate a signal for adjusting a gain of said at least one amplifier.

56. The control module of claim 55, wherein the control logic is configured to generate a signal for adjusting a gain of said at least one amplifier so as to reduce said operating resolution of said analog-to-digital converter.

57. The control module of claim 53, wherein said radio channel is a code division multiple access channel conveying a spread spectrum transmission.

58. The control module of claim 57, wherein the detected value is a value of a received code channel after despreading the transmission of said radio channel.

59. The control module of claim 57, wherein the target resolution is a number of bits required to decode received information in a received code channel after despreading the transmission of said radio channel.

60. The control module of claim 53, wherein said detected value is a signal strength of said radio channel.

61. The control module of claim 53, wherein said detected value is a signal-to-interference ratio of said radio channel.

62. The control module of claim 53, wherein said detected value includes a power of a code division multiple access channel conveying a spread spectrum transmission.

63. The control module as defined in claim 53, wherein said detector in communication with said signal associated with said digital output signal is configured so that the measuring of said received signal parameter is such that the detector is configured to determine a first signal parameter based on a signal associated with the digital output signal after filtering and despreading and a second signal parameter based on a signal associated with the digital output signal prior to said filtering, and further wherein said control logic is configured to determine the operating resolution based on said full-scale resolution of the analog-to-digital converter, the target resolution, and said first and second parameters.

64. The control module as defined in claim 63, wherein said radio channel is a code division multiple access channel conveying a spread spectrum transmission.

65. The control module as defined in claim 63, wherein the target resolution is the number of bits required to decode received information in a received code channel after despreading the transmission of said radio channel.

66. A method comprising:
performing an analog to digital conversion at an operating resolution of a signal associated with a radio channel into a digital output signal by an analog-to-digital converter;
measuring a received signal parameter of said radio channel based on a signal associated with said digital output signal; and
determining the operating resolution based on a full-scale resolution, a target resolution, and said received signal parameter, wherein the target resolution is a resolution necessary to decode said radio channel assuming no interference from potentially interfering radio channels.

67. The method of claim 66, wherein the determining of the operating resolution is performed repetitively.

68. The method of claim 67, further comprising modifying the repetitive determination of the operating resolution when a signal associated with said radio channel is changing faster than a predetermined amount.

69. The method of claim 66, wherein the operating resolution is the full-scale resolution less said received signal parameter of said radio channel plus said target resolution.

70. The method of claim 66, wherein the determining of the operating resolution is performed repetitively if the received signal parameter is outside of limits specified for the measurements of received signal parameter.

71. The method of claim 70, wherein said limits are based on a predetermined threshold value of said received signal parameter.

72. The method of claim 66, further comprising amplifying said signal associated with said radio channel prior to converting the signal into a digital output signal.

73. The method of claim 72, wherein the amplifying has an adjustable gain that is adjusted so as to reduce the determined operating resolution.

74. The method of claim 73, wherein the adjustable gain is adjusted by comparing said digital output signal with a value at least based on said full-scale resolution and another value.

75. The method of claim 74, wherein said another value is at least based upon a fading margin.

76. The method of claim 66, wherein said signal associated with said radio channel is a signal in a radio frequency domain, said method further comprising amplifying said signal while in the radio frequency domain.

77. The method of claim 76, wherein the amplifying has an adjustable gain that is adjusted so as to reduce the determined operating resolution.

78. The method of claim 66, wherein the measuring of said received signal parameter of said radio channel is based on an average of measurements of said received signal parameter.

79. The method of claim 66, wherein said received signal parameter is a signal-to-interference ratio of said radio channel.

80. The method of claim 66, wherein said received signal parameter includes a received power of a code division multiple access channel conveying a spread spectrum transmission.

81. The method of claim 80, wherein said target resolution is at least based on a code channel power.

82. The method of claim 66, wherein said target resolution is at least based on a code channel power of a code division multiple access channel conveying a spread spectrum transmission.

83. The method according to claim 66, wherein the measuring of said received signal parameter determines a first signal parameter based on a signal associated with the digital output signal after filtering and despreading and a second signal parameter based on a signal associated with the digital output signal prior to said filtering, and further wherein the determining the operating resolution is based on said full-scale resolution of the analog-to-digital converter, the target resolution, and said first and second parameters.

84. The method as defined in claim 83, wherein said radio channel is a code division multiple access channel conveying a spread spectrum transmission.

85. The method as defined in claim 83, wherein the target resolution is the number of bits required to decode received information in a received code channel after despreading the transmission of said radio channel.

86. An apparatus comprising:
means for converting at an operating resolution a signal associated with a radio channel into a digital output signal;
means for measuring a received signal parameter of said radio channel based on a signal associated with the digital output signal; and
means for determining the operating resolution based on a full-scale resolution of the analog-to-digital converter, a target resolution, and said received signal parameter, wherein the target resolution is the resolution necessary to decode said radio channel assuming no interference from potentially interfering radio channels.

87. The apparatus of claim 86, wherein the means for determining the operating resolution repetitively determines said operating resolution.

88. The apparatus of claim 86, wherein the received signal parameter is a received signal strength of said radio channel.

* * * * *